United States Patent
Eyole et al.

(10) Patent No.: US 10,224,099 B1
(45) Date of Patent: Mar. 5, 2019

(54) METHOD, SYSTEM AND DEVICE FOR ERROR CORRECTION IN READING MEMORY DEVICES

(71) Applicant: ARM Ltd., Cambridge (GB)

(72) Inventors: Mbou Eyole, Cambridge (GB); Shidhartha Das, Cambridge (GB); Emre Ozer, Cambridge (GB); Xabier Iturbe, Cambridge (GB)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/890,191

(22) Filed: Feb. 6, 2018

(51) Int. Cl.
| G11C 13/00 | (2006.01) |
| G11C 29/50 | (2006.01) |
| G06F 11/10 | (2006.01) |
| G11C 29/52 | (2006.01) |

(52) U.S. Cl.
CPC ........ *G11C 13/004* (2013.01); *G06F 11/1068* (2013.01); *G11C 13/0069* (2013.01); *G11C 29/50008* (2013.01); *G11C 29/52* (2013.01); *G11C 13/0007* (2013.01); *G11C 2013/005* (2013.01); *G11C 2213/31* (2013.01); *G11C 2213/32* (2013.01)

(58) Field of Classification Search
CPC .......... G11C 13/003–13/0069; G11C 2213/75; G11C 11/411–11/416; G11C 11/4116
See application file for complete search history.

(56) References Cited

U.S. PATENT DOCUMENTS

| | | | |
|---|---|---|---|
| 9,514,814 B1 * | 12/2016 | Sandhu | G11C 11/56 |
| 9,548,118 B1 * | 1/2017 | Bhavnagarwala | G11C 13/0069 |
| 9,558,819 B1 | 1/2017 | Aitken et al. | |
| 9,589,636 B1 | 3/2017 | Bhavnagarwala et al. | |
| 9,621,161 B1 | 4/2017 | Das et al. | |
| 9,627,615 B1 | 4/2017 | Reid et al. | |
| 9,660,189 B1 | 5/2017 | Reid et al. | |
| 9,734,895 B2 | 8/2017 | Savanth et al. | |
| 9,735,360 B2 | 8/2017 | Shifren et al. | |
| 9,735,766 B2 | 8/2017 | Shifren | |
| 9,747,982 B1 | 8/2017 | Shifren et al. | |
| 9,748,943 B2 | 8/2017 | Sandhu et al. | |
| 9,755,146 B2 | 9/2017 | Shifren et al. | |
| 9,773,550 B2 | 9/2017 | Bhavnagarwala et al. | |
| 10,002,665 B1 * | 6/2018 | Bhargava | G11C 13/0002 |
| 2017/0033782 A1 | 2/2017 | Shifren | |

(Continued)

*Primary Examiner* — Hien Nguyen
(74) *Attorney, Agent, or Firm* — Berkeley Law & Technology Group, LLP

(57) ABSTRACT

Disclosed are devices and methods for storing values, symbols, parameters or conditions in memory devices as states, and subsequently mapping detected states as values, symbols parameters or conditions. In one implementation write operations may place first and second memory elements in a particular impedance state selected from between a low impedance or conductive state and a high impedance or insulative state. The high impedance or insulative state represents a first binary value or symbol while the low high impedance or conductive state represents a second binary value or symbol. Subsequently detected impedance states of the first and second memory elements may be mapped to the second binary value or symbol responsive to either of the detected impedance states being the high impedance or insulative state and the second detected impedance state.

23 Claims, 7 Drawing Sheets

(56) References Cited

U.S. PATENT DOCUMENTS

| | | | |
|---|---|---|---|
| 2017/0045905 A1 | 2/2017 | Sandhu et al. | |
| 2017/0047115 A1 | 2/2017 | Aitken et al. | |
| 2017/0047116 A1 | 2/2017 | Sandhu et al. | |
| 2017/0047919 A1 | 2/2017 | Sandhu et al. | |
| 2017/0069378 A1* | 3/2017 | Shifren | G11C 13/0069 |
| 2017/0077400 A1 | 3/2017 | Shifren et al. | |
| 2017/0084331 A1 | 3/2017 | Bhavnagarwala et al. | |
| 2017/0092858 A1 | 3/2017 | Shifren | |
| 2017/0099049 A1 | 4/2017 | Sandhu et al. | |
| 2017/0103809 A1 | 4/2017 | Bhavnagarwala et al. | |
| 2017/0110191 A1 | 4/2017 | Aitken et al. | |
| 2017/0117043 A1 | 4/2017 | Sandhu et al. | |
| 2017/0147207 A1 | 5/2017 | Hansson et al. | |
| 2017/0178718 A1 | 6/2017 | Savanth et al. | |
| 2017/0178724 A1 | 6/2017 | Bhavnagarwala et al. | |
| 2017/0179385 A1 | 6/2017 | Shifren et al. | |
| 2017/0206963 A1 | 7/2017 | Bhavnagarwala et al. | |
| 2017/0207784 A1 | 7/2017 | Das et al. | |
| 2017/0213592 A1 | 7/2017 | Bhavnagarwala et al. | |
| 2017/0213960 A1 | 7/2017 | Paz De Araujo et al. | |
| 2017/0213961 A1 | 7/2017 | Paz De Araujo et al. | |
| 2017/0237001 A1 | 8/2017 | Reid et al. | |
| 2017/0243621 A1 | 8/2017 | Aitken et al. | |
| 2017/0243622 A1 | 8/2017 | Sandhu et al. | |
| 2017/0243646 A1 | 8/2017 | Shifren et al. | |
| 2017/0244027 A1 | 8/2017 | Reid et al. | |
| 2017/0244032 A1 | 8/2017 | Reid et al. | |
| 2017/0250340 A1 | 8/2017 | Paz De Araujo et al. | |
| 2018/0012658 A1* | 1/2018 | Aitken | G11C 13/0069 |

* cited by examiner

… … …

METHOD, SYSTEM AND DEVICE FOR ERROR CORRECTION IN READING MEMORY DEVICES

BACKGROUND

1. Field

Disclosed are techniques for utilizing memory devices.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

Some types of non-volatile memory employ devices that store a value, parameter or symbol based on a detectable impedance or resistance between terminals of a non-volatile memory element. Such devices may include, for example, FeRAMs (Ferroelectric RAMs), magnetic memories (MRAMs), phase change memories (PCMs) and correlated electron devices formed from correlated electron material (CEM), just to provide a few examples. In some scenarios, ambient operating conditions may erroneously affect a detectable impedance or resistance of a non-volatile memory device so as to erroneously affect a value, symbol, condition or parameter being represented by a resistance or impedance state of the non-volatile memory device.

SUMMARY

Briefly, particular implementations are directed to a method comprising: determining a binary value or symbol to be stored in first and second memory elements of a memory device; performing write operations to place the first memory element and the second memory element in a particular impedance state representing the value, the particular impedance state being selected from between a low impedance or conductive state and a high impedance or insulative state, the high impedance or insulative state representing a first binary value or symbol and the low impedance or conductive state representing a second binary value or symbol; performing a first read operation to determine a first detected impedance state of the first memory element; performing a second read operation to determine a second detected impedance state of the second memory element; and mapping the first and second detected impedance states to the same binary value or symbol responsive to the first detected impedance state being the high impedance or insulative state and the second detected impedance state being the low impedance or conductive state.

Another particular implementation is directed to an apparatus comprising: first and second memory elements; a programming circuit to apply programming signals placing the first and second memory elements in a particular impedance state representing a determined binary value or symbol, the particular impedance state being selected from between a low impedance or conductive state and a high impedance or insulative state, the high impedance or insulative state representing a first binary value or symbol and the low high impedance or conductive state representing a second binary value or symbol; a circuit to perform read operations to determine a first detected impedance state of the first memory element and determine a second detected impedance state of the second memory element; and a mapping circuit to map the first detected impedance state of the first memory element and the second detected impedance state of the second memory element to the same binary value or symbol responsive to the first detected impedance state being the high impedance or insulative state and the second detected impedance state being the low impedance or conductive state.

Another particular implementation is directed to an apparatus comprising: a plurality of bitcells formed as an array bitcells, each bitcell comprising first and second memory elements, each bitcell being coupled to at least one other bitcell by a first bitline and a second bitline; and a plurality of programming circuits, each programming circuit to apply programming signals placing first and second memory elements of a selected bitcell in a particular impedance state representing a determined binary value or symbol, the particular impedance state being selected from between a low impedance or conductive state and a high impedance or insulative state, the high impedance or insulative state representing a first binary value or symbol and the low high impedance or conductive state representing a second binary value or symbol, the programming circuit comprising: a circuit to perform read operations to determine a first detected impedance state of the first memory element and determine a second detected impedance state of the second memory element; and a mapping circuit to map the first detected impedance state of the first memory element and the second detected impedance state of the second memory element to the same binary value or symbol responsive to the first detected impedance state being the high impedance or insulative state and the second detected impedance state being the low impedance or conductive state.

It should be understood that the aforementioned implementations are merely example implementations, and that claimed subject matter is not necessarily limited to any particular aspect of these example implementations.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1A:
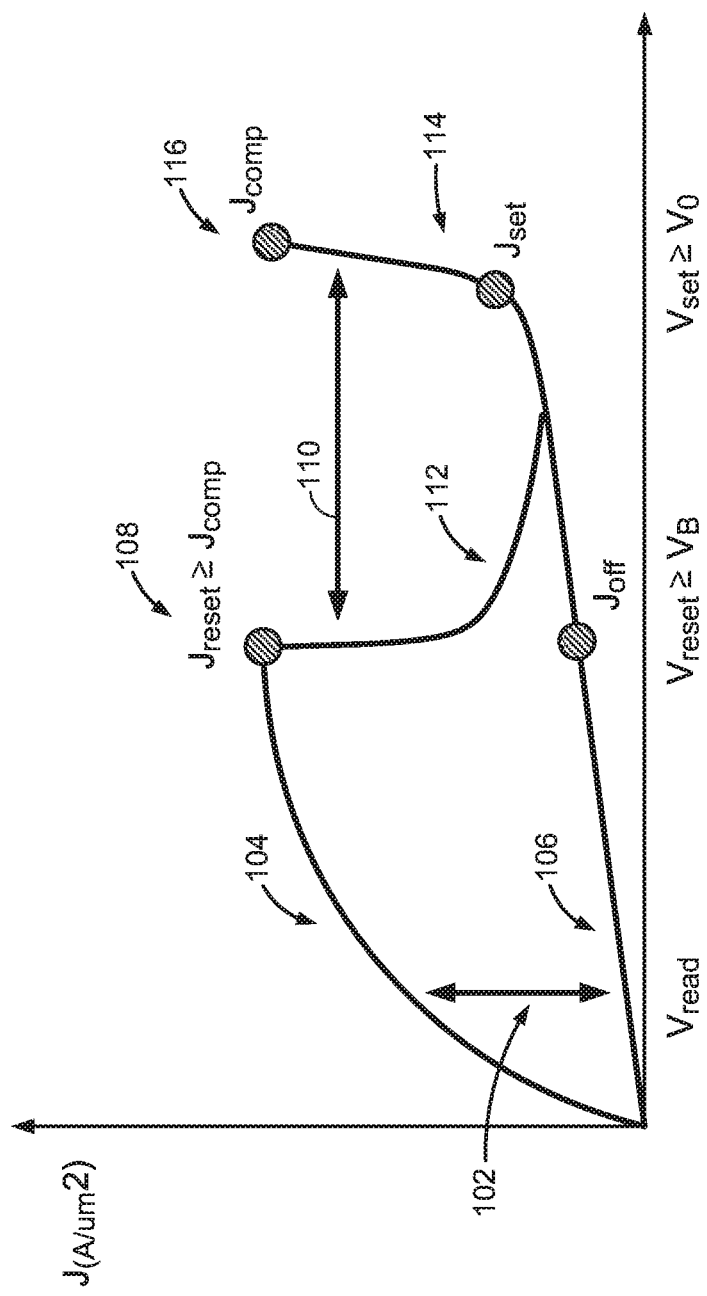
FIG. 1A shows a plot of current density versus voltage for a correlated electron switch (CES) element according to an embodiment.

Reference is made in the following detailed description to accompanying drawings, which form a part hereof, wherein like numerals may designate like parts throughout that are identical, similar and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

In some scenarios, ambient operating conditions may erroneously affect a detectable impedance or resistance of a non-volatile memory device so as to erroneously affect a value, symbol, condition or parameter being represented by a resistance or impedance state of the non-volatile memory device. Particular implementations are directed to enhancing reliability of systems employing non-volatile memory devices in the presence of such operating conditions. In particular types of memory devices, such as Correlated-electron Random Access Memory (CeRAM) non-volatile storage devices, there is an increase in the susceptibility of devices to "soft errors" as processing technology nodes continue to shrink, and this particular issue is critical in the case of CeRAM because transient faults could lead to permanent faults if the bitcell resistance is accidentally reprogrammed.

Soft errors may arise, for example, due to particles (alpha particles, neutrons, etc.) which strike the silicon substrate and affect pn junctions. Single Event Upsets (SEUs) may occur if there is a resulting injection of charge which can cause circuits to behave incorrectly and lead to the corruption of data saved in registers or memory. SRAM bitcells, latches and flip-flops are particularly vulnerable; and as a result, devices such as reconfigurable devices which use memory elements extensively in their look-up tables and routing structures are very sensitive to SEUs.

Techniques for mitigating soft errors may include, for example, radiation hardening during design and manufacture, and/or employing parity or error-correcting code (ECC) bits. The addition of extra bits may enable detection of errors, or to correct errors in the memory elements in addition to detection. It may be particularly useful to be able to both detect and correct errors in-place so for example, the popular SECDED code is a Hamming code with additional parity which can detect and correct a single-bit error and can detect but not correct a double-bit error. Radiation hardening adds significant cost and complexity during manufacturing, and ECC mechanisms may add overhead which can impact performance and cost. Particular implementations described herein are directed to both reliably detecting and correcting errors due to SEUs affecting non-volatile memory cells such as CeRAM memory cells.

In particular embodiments, optimizing designs may involve making a trade-off between reliability and storage capacity by constructing a circuit implementing a scheme in such a manner that a storage cell can function as either as non-volatile piece of storage with full memory capacity and no error detection or correction facility, or a non-volatile piece of storage with half the memory capacity and full error detection and correction facilities. Aspects of this feature may be particularly useful in circuits within reconfigurable fabrics since certain parts of a configurable fabric may be deemed to be critical while other parts of the configurable fabric may have less stringent reliability requirements. In such parts having less stringent reliability requirements, additional capacity may be made available.

Particular aspects of embodiments enable taking advantage of statistical properties including likelihoods of particular events giving rise to particular types errors in states of non-volatile memories arising from SEUs. For example, particular implementations are directed to taking advantage of particular statistical properties of the possible error transitions between impedance states within CeRAM storage cells.

Particular implementations employ correlated electron switch (CES) elements or devices (e.g., implemented as CeRAM devices) to store values or symbols as impedance states that may be detectable in read operations. A CES element may be formed by a Correlated Electron Material (CEM). In this context, a CES element may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES element may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES element between an insulative state and a conductive state may be understood in terms of a Mott transition. In a Mott transition, a material may switch from an insulative state to conductive state if a Mott transition condition occurs. The criteria may be defined by the condition $(nc)^{1/3} a=0.26$), where nc is a concentration of electrons and "a" is a Bohr radius. If a critical carrier concentration is achieved such that the Mott criteria is met, a Mott transition may occur and state may change between a high resistance/capacitance and a low resistance/capacitance.

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In particular implementations of aspects of this disclosure, a resistive switching integrated circuit memory may comprise: a resistive switching memory cell including a CES element; a write circuit for placing the resistive switching memory cell in a first impedance state or a second impedance state depending on signals provided to the memory cell, wherein an impedance of the CES element is higher in the second impedance state than in the first impedance state; and a read circuit for sensing the state of the memory cell and providing an electrical signal corresponding to the sensed state of the memory cell. In a particular implementation, a CES element may switch between impedance states responsive to a quantum mechanical change such as a Mott transition or Mott-like transition in a portion of CEM forming the CES element. In one aspect, a CES element may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In a particular embodiment, a CES device may be formed as a "CEM random access memory (CeRAM)" device. In this context, a CeRAM device comprises a material that may transition between or among a plurality of predetermined detectable memory states based, at least in part, on a transition of at least a portion of the material between a low impedance conductive state and a high impedance or insulative state utilizing a quantum mechanical state transition such as a change in a localization or concentration of electrons in a region of material forming the CeRAM device. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned low impedance or conductive state and high impedance or insulative state. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first memory state referred to as an insulative or high impedance memory state the memory device in one aspect is less conductive (or more insulative) than while the memory device in a second memory state referred to as a conductive or low impedance memory state. Furthermore, as discussed below with respect to a particular implementation, a CES element may be placed in any one of two or more different and distinguishable low impedance or conductive states.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1A shows a plot of current density versus voltage across terminals (not shown) for a CES element according to an embodiment. Based, at least in part, on a voltage applied to terminals of the CES element (e.g., in a write operation), the CES element may be placed in a conductive state or an insulative state. For example application of a voltage $V_{set}$ and current density $J_{set}$ may place the CES element in a conductive memory state and application of a voltage $V_{reset}$ and a current density $J_{reset}$ may place the CES element in an insulative memory state. Following placement of the CES element in an insulative state or conductive state, the particular state of the CES element may be detected by application of a voltage $V_{read}$ (e.g., in a read operation) and detection of a current or current density at terminals of the CeRAM device.

According to an embodiment, the CES element of FIG. 1A may include any TMO, such as, for example, perovskites, Mott insulators, charge exchange insulators, and Anderson disorder insulators. In particular implementations, a CES element may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES element. In an embodiment, a CES element may be prepared without electroforming. Other implementations may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from claimed subject matter.

In one aspect, the CES element of FIG. 1A may comprise materials that are TMO metal oxide variable resistance materials, though it should be understood that these are exemplary only, and are not intended to limit claimed subject matter. Particular implementations may employ other variable resistance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences. In another particular example, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned quantum mechanical condition is met (injected electron holes=the electrons in a switching region), the CES element may rapidly switch from a conductive state to an insulator state via the Mott transition. This may occur at point 108 of the plot in FIG. 1A. At this point, electrons are no longer screened and become localized. This correlation may result in a strong electron-electron interaction potential which splits the bands to form an insulator. While the CES element is still in the insulative state, current may be generated by transportation of electron holes. If enough bias is applied across terminals of the CES element, electrons may be injected into a metal-insulator-metal (MIM) diode over the potential barrier of the MIM device. If enough electrons have been injected and enough potential is applied across terminals to place the CES element in a particular low impedance or conductive state, an increase in electrons may screen electrons and remove a localization of electrons, which may collapse the band-splitting potential forming a metal.

According to an embodiment, current in a CES element may be controlled by an externally applied "compliance" condition determined based, at least in part, on an external current limited during a write operation to place the CES element in a conductive or low impedance state. This externally applied compliance current may also set a condition of a current density for a subsequent reset operation to place the CES element in a high impedance or insulative state. As shown in the particular implementation of FIG. 1A, a current density J$_{comp}$ applied during a write operation at point 116 to place the CES element in a conductive or low impedance state may determine a compliance condition for placing the CES element in a high impedance or insulative state in a subsequent write operation. As shown, the CES device may be subsequently placed in an insulative or high impedance state by application of a current density J$_{reset}$≥J$_{comp}$ at a voltage V$_{reset}$ at point 108, where J$_{comp}$ is externally applied.

The compliance therefore may set a number of electrons in a CES element which are to be "captured" by holes for the Mott transition. In other words, a current applied in a write operation to place a CES element in a conductive memory state may determine a number of holes to be injected to the CES element for subsequently transitioning the CES element to an insulative memory state.

As pointed out above, a reset condition may occur in response to a Mott transition at point 108. As pointed out above, such a Mott transition may occur at condition in a CES element in which a concentration of electrons n equals a concentration of electron holes p. This condition may be modeled according to expression (1) as follows:

$$\lambda_{TF} n^{\frac{1}{3}} = C \sim 0.26 \qquad (1)$$

$$n = \left(\frac{C}{\lambda_{TF}}\right)^3$$

where:
$\lambda_{TF}$ is a Thomas Fermi screening length; and
C is a constant.

According to an embodiment, a current or current density in a region 104 of the plot shown in FIG. 1A may exist in response to injection of holes from a voltage signal applied across terminals of a CES element. Here, injection of holes may meet a Mott transition criterion for the conductive state to insulative state transition at current I$_{MI}$ as a critical voltage V$_{MI}$ is applied across terminals of CES element. This may be modeled according to expression (2) as follows:

$$I_{MI}(V_{MI}) = \frac{dQ(V_{MI})}{dt} \approx \frac{Q(V_{MI})}{t} \qquad (2)$$

$$Q(V_{MI}) = qn(V_{MI})$$

Where Q(V$_{MI}$) is the charged injected (hole or electron) and is a function of an applied voltage.

Injection of electron holes to enable a Mott transition may occur between bands and in response to critical voltage V$_{MI}$ and critical current I$_{MI}$. By equating electron concentration n with a charge concentration to bring about a Mott transition by holes injected by I$_{MI}$ in expression (2) according to expression (1), a dependency of such a critical voltage V$_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$

$$J_{reset}(V_{MI}) = J_{MI}(V_{MI}) = \frac{I_{MI}(V_{MI})}{A_{CeRam}} = \frac{q}{A_{CeRam} t}\left(\frac{C}{\lambda_{TF}(V_{MI})}\right)^3$$

Where:
A$_{ceRam}$ is a cross-sectional area of a GES element; and
J$_{reset}$(V$_{MI}$) is a current density through the GES element to be applied to the CES element at a critical voltage V$_{MI}$ to place the CES element in an insulative state.

According to an embodiment, a CES element may be placed in a conductive memory state (e.g., by transitioning from an insulative memory state) by injection of a sufficient number of electrons to satisfy a Mott transition criteria.

In transitioning a CES element to a conductive memory state, as enough electrons have been injected and the potential across terminal of the CES element overcomes a critical switching potential (e.g., $V_{set}$), injected electrons begin to screen and unlocalize double-occupied electrons to reverse a disproportion reaction and closing the bandgap. A current density $J_{set}(V_{MI})$ for transitioning the CES element to the conductive memory state at a critical voltage $V_{MI}$ enabling transition to the conductive memory state may be expressed according to expression (4) as follows:

$$I_{MI}(V_{MI}) = \frac{dQ(V_{MI})}{dt} \approx \frac{Q(V_{MI})}{t} \quad (4)$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{set}(V_{MI}) = J_{injection}(V_{MI}) = J_{MI}(V_{MI}) = \frac{I_{MI}(V_{MI})}{A_{CeRam}} = \frac{q}{A_{CeRam}t}\left(\frac{C}{a_B}\right)^3$$

where:
$a_B$ is a Bohr radius.

According to an embodiment, a "read window" 102 for detecting a memory state of a CES element in a read operation may be set out as a difference between a portion 106 the plot of FIG. 1A while the CES element is in an insulative state and a portion 104 of the plot FIG. 1A while the CES element is in a conductive state at a read voltage $V_{read}$. In a particular implementation, read window 102 may be used to determine a Thomas Fermi screening length $\lambda_{TF}$ of material making up the CES element. For example, at a voltage $V_{reset}$, current densities $J_{reset}$ and $J_{set}$ may be related to according to expression (5) as follows:

$$\lambda_{TF}(@V_{reset}) = a_B\left(\frac{J_{reset}}{J_{off}}\right)^{\frac{1}{3}} \quad (5)$$

In another embodiment, a "write window" 110 for placing a CES element in an insulative or conductive memory state in a write operation may be set out as a difference between $V_{reset}$ (at $J_{reset}$) and $V_{set}$ (at $J_{set}$). Establishing $|V_{set}|>|V_{reset}|$ enables a switch between conductive and insulative state. $V_{reset}$ may be approximately at a band splitting potential arising from correlation and $V_{set}$ may be approximately twice the band splitting potential. In particular implementations, a size of write window 110 may be determined based, at least in part, by materials and doping of the CES element.

Figure 1B:
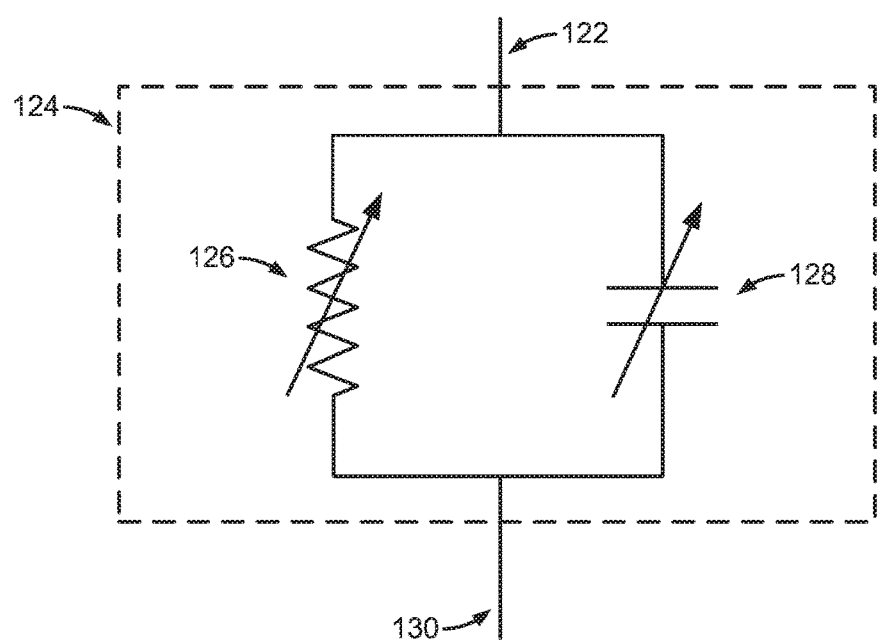
FIG. 1B is a schematic diagram of an equivalent circuit to a CES element according to an embodiment.

The transition from high resistance/capacitance to low resistance/capacitance in a CES element may be represented by a singular impedance of the CES element. FIG. 1B depicts a schematic diagram of an equivalent circuit of an example variable impeder device (such as a CES element), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Of course, although a variable resistor 126 and variable capacitor 128 are depicted in FIG. 1B as comprising discrete components, a variable impeder device, such as variable impeder device 124, may comprise a substantially homogenous CEM, wherein the CEM comprises characteristics of variable capacitance and variable resistance. Table 1 below depicts an example truth table for an example variable impeder device, such as variable impeder device 124.

TABLE 1

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

In the particular implementation of a CES element of FIG. 1A, the CES element may be placed in either of two different impedance states: a low impedance or conductive state responsive to a set operation and a high impedance or insulative state responsive to a reset operation. According to an embodiment, a CES element may be placed in a low impedance or conductive state, in addition to a high impedance or insulative state. As such, the CES element may be programmable in a write operation to be in any one of three or more distinguishable impedance states. This may expand a usefulness of a CES element beyond merely representing a binary state.

Different processes for the fabrication of CES elements in a circuit (e.g., in combination with processes to fabricate other devices such as FETs using CMOS processing) may be defined by different fabrication parameters. Different processes for fabricating devices (e.g., according to particular defined "processing nodes") may be defined or specified, at least in part, by various parameters or variables yielding varying results. For example, different processes for fabricating devices may yield different performance and endurance characteristics.

Figure 2:
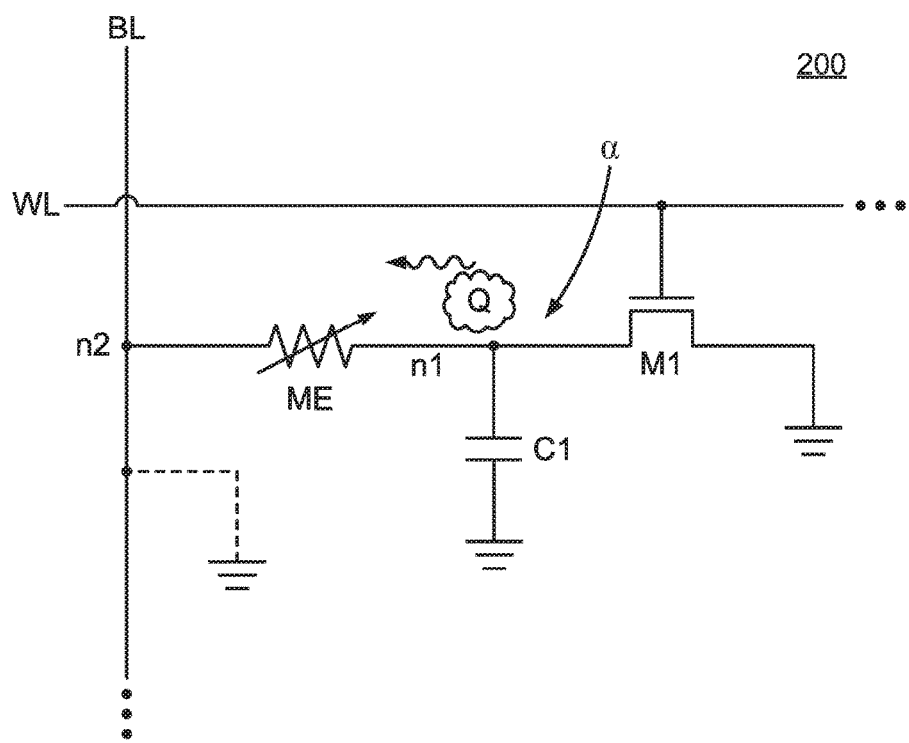
FIG. 2 is a schematic diagram of a circuit of a memory bitcell according to an embodiment.

FIG. 2 is a schematic diagram of a circuit 200 of a memory bitcell according to an embodiment. In this context, a "bitcell" or "bitcell circuit" as referred to herein comprises a circuit or portion of a circuit capable of representing a value, symbol or parameter as a state. For example, a bitcell may comprise one or more memory devices that capable of representing a value, symbol or parameter as a memory state of the memory device. In particular implementations, a bitcell may represent a value, symbol or parameter as a single bit or multiple bits.

Circuit 200 comprises a memory element ME which may comprise any one of several types of resistive non-volatile memory devices including, for example, a PCM element, a FeRAM element, MRAM element or CES element (e.g., CeRAM element), just to provide a few examples. While particular examples discussed below in connection with FIGS. 2 and 3 use CeRAM elements as specific examples of a resistive non-volatile memory element, it should be understood other types of non-volatile resistive memory device may be used without deviating from claimed subject matter. Here, an effect of a particle strike may be modeled around node n1, connecting one terminal of memory element ME and a drain terminal of transistor M1. According to an embodiment, node n1 may be the most vulnerable node. Node n2 may be less vulnerable due to a large capacitance at node n2. The particle strike and the concomitant injection of charge at node n1 may bring about a transient current ΔI to flow through transistor M1 and memory element ME during a write operation (e.g., a SET or RESET operation applied to a CES element as discussed above). Here, voltages for initiating a SET or RESET operation may be modeled as follows:

$$Vr=V_{SET}+(\Delta I)*R \qquad \text{SET operation:}$$

$$Vr=V_{RESET}+(\Delta I)*R, \qquad \text{RESET operation:}$$

wherein R is a resistance or impedance of memoryelement ME (which depends on whether memory element ME is in a low impedance or conductive state, or a high impedance or insulative state).

As pointed out above in FIG. 1A, a CES element may have a write window 110 determined at least in part by specific materials and doping of CEM used to form the CES element. This write window may be affected or skewed in the presence of SEUs introducing transient current ΔI.

According to an embodiment, memory element ME may comprise a CES having a behavior similar to that of the CES element discussed above in connection with FIG. 1A. For example, a memory element in bitcell 200 may be placed in a particular memory state (e.g., two or more distinguishable conductive or low impedance memory states, or insulative or high impedance memory state) by independently controlling voltage and current applied across terminals of the memory element in a "write operation." As discussed above in particular implementations, such a write operation may be executed by application of a signal which is controlled to provide a critical current and voltage across terminals of the memory device to place the memory device in a particular memory state. In another aspect, a memory state of a memory element in bitcell 200 may be detected or sensed in a "read operation."

In this context, a "conducting element" comprises a circuit element capable of permitting current to pass between two nodes. In a particular implementation, a conducting element may vary a current permitted to pass between nodes based, at least in part, on a particular condition. The particular implementations described below employ FETs as conducting elements to permit current to pass between source and drain terminals based, at least in part, on a voltage applied to a gate terminal. It should be understood, however, that other types of devices such as, a bipolar transistor, diode, variable resistor, etc. may be used as a conducting element, and that claimed subject matter is not limited this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

In the particular implementation of memory element ME as a CES element behaving as illustrated in FIG. 1A, it may be observed that $|V_{SET}|>|V_{RESET}|$. It may be further observed that following a SET operation to place the CES element in a low impedance or conductive state, there is a certain probability that the CES element may in fact be placed in, remain in or transition to a high impedance or insulative state (e.g., responsive to transient current ΔI). Likewise, it may be further observed that following a RESET operation to place the CES element in a high impedance or insulative state, there is a certain probability that the CES element may in fact be placed in, remain in or transition to a low impedance or conductive insulative state (e.g., responsive to transient current ΔI). Such probabilities may be estimated based on a probability distribution of voltage spikes. If a CES element is placed in a high impedance or insulative state at the start of a transition, a probability distribution will be narrower for the SET case than the RESET case because RON<<ROFF. In other words, modelling the injection of charge as a transient current source and calculating the voltage across other words, it may be deduced that a probability of an erroneous transition from an initial insulative or high impedance state following a write operation may be smaller than a probability of an erroneous transition from an initial conductive or low impedance state following a write operation. From this consideration, one may deduce that the probability of a CES element in a low impedance or conductive state (e.g., representing a value or symbol "1") inadvertently transitioning to a high impedance or insulative state (e.g., representing a value or symbol "0") is considerably higher than the CES element inadvertently transitioning from a high impedance or insulative state to a low impedance or conductive state. Similarly, in an operation to read a CES element, it may be observed that transient current while the CES element is in a low impedance or conductive state may be significantly more than transient current while the CES element is in a high impedance or insulative state. Accordingly, if the CES element is accessed for a read operation, detecting a low impedance or conductive state incorrectly while the CES element is actually in a high impedance or insulative state is less likely than detecting a high impedance or insulative state while the CES element is actually in a low impedance or conductive state. Referring to the example implementation of FIG. 2, a selection of signal WL may be deasserted to open transistor M1. As such, there is no effective path from node n1 to ground through transistor M1. Charge Q collected at node n1 may give rise to a transient current to flow through memory element ME and a transient voltage may appear at n1 due to capacitance C1. A resultant transient current and potential difference across the impedance can cause the CES element to be "reset" and enter a high impedance or insulative state.

Recognizing that a probability that a state of a CES is erroneously detected as being in a high impedance or insulative state is significantly higher than a probability that the state of the CES is erroneously detected as being in a low impedance or conductive state, single bit errors may be addressed using only two bits to represent a single binary symbol, value parameter or condition. This is illustrated in Table 2 below where a high impedance or insulative state represents a "0" and a low impedance or conductive state represents a "1." It should be understood, however, that a high impedance or insulative state and a low impedance or conductive state may represent different values or symbols, and that claimed subject matter is not limited to the presently illustrated example.

TABLE 2

| As Detected in Read Operation (with single-bit errors) | | Representation of Defined State in bitcells (with no single-bit errors) | | |
|---|---|---|---|---|
| Bit1 | Bit0 | Bit1 | Bit0 | Defined State |
| 0 | 0 | 0 | 0 | 0 |
| 0 | 1 | 1 | 1 | 1 |
| 1 | 0 | 1 | 1 | 1 |
| 1 | 1 | 1 | 1 | 1 |

As illustrated in Table 2, a defined state is to be redundantly expressed in bitcells Bit1 and Bit0. Values detected from bitcells Bit1 and Bit0 in a read operation may be mapped to a single value or symbol (e.g., a single "0" or "1"). Recognizing that a bitcell value or symbol being incorrectly read as a "0" is significantly higher than a bitcell value or symbol being incorrectly read as a "1," values detected from bitcells Bit1 and Bit0 in a read operation may be mapped to a single value according to an "or" (OR) operation. Here, as summarized in Table 1 a value or symbol of "0" detected in a read operation from bitcells Bit1 and Bit0 may be mapped to a value or symbol of "0." In all other cases where a symbol or value of "1" is detected in a read operation for at least one bitcell, the values or symbols detected from bitcells Bit1 and Bit0 are mapped to a symbol or value of "1." One particular advantage of this scheme is to provide a significantly simpler error correction for a memory bit using only two bits (or one redundant bit). This may enable an increased reliability in the storage and retrieval of a single binary value or symbol using less than three bits.

Figure 3A:
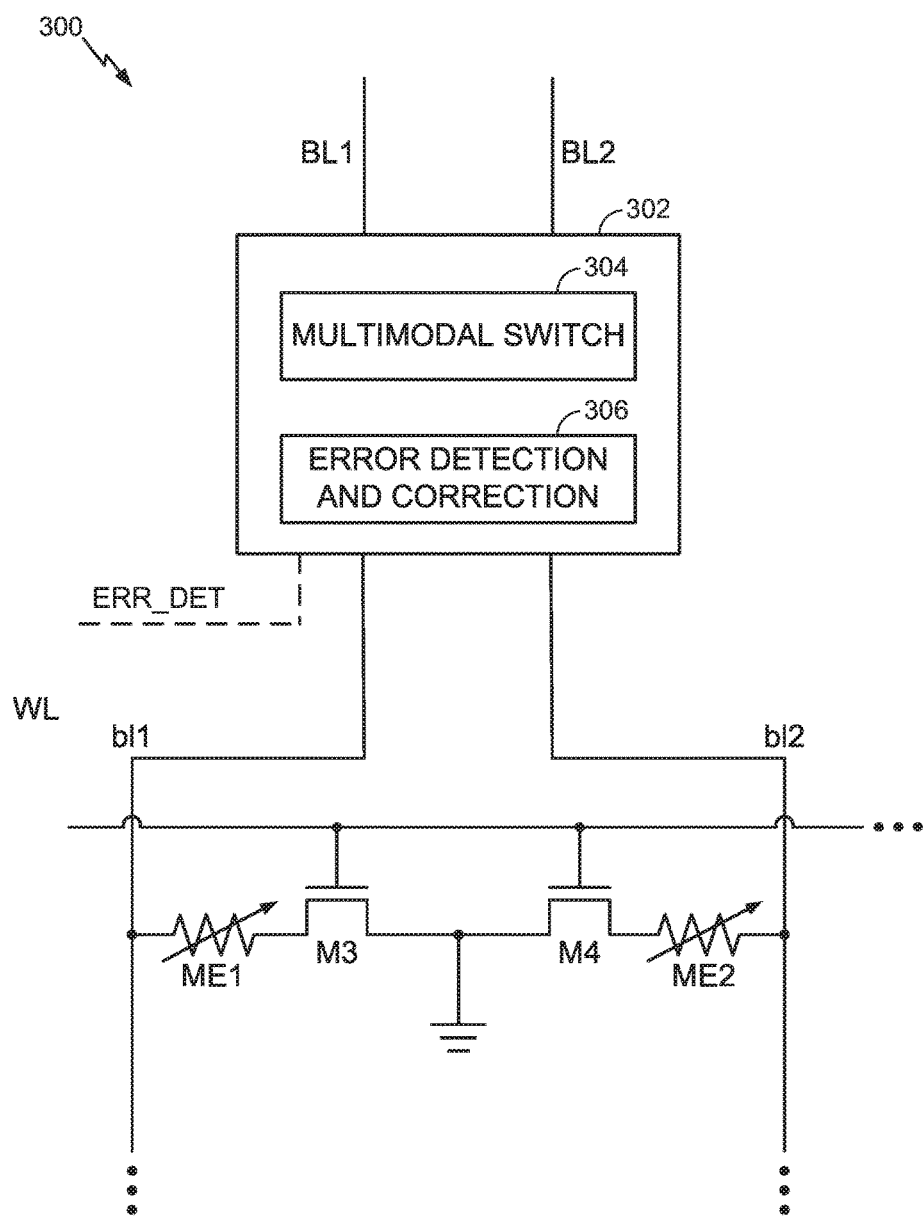
FIG. 3A is a schematic diagram of a circuit for applying operations to memory elements according to an alternative embodiment.

FIG. 3A is a schematic diagram of a circuit 300 for applying operations to memory elements according to embodiment of a scheme to employ error correction as described above. Here, memory elements ME1 and ME2 are implemented to form 1T1R bitcells which are accessible for read or write operations responsive to a voltage on wordline WL applied to gate terminals of transistors M3 and M4 functioning as conducting elements. In a write operation, transistors M3 and M4 may close to couple memory element ME1 between a reference node and bitline Bl1 and to couple memory element ME2 between the reference node and bitline Bl2. As discussed above, memory elements ME1 and ME2 may comprise CES elements behaving as illustrated in FIG. 1A. Again, other types of memory devices may be used without deviating from claimed subject matter. Here, bitlines Bl1 and Bl2 coupled to a programming circuit, the programming circuit comprising write driver circuitry (not shown), may apply programming signals across terminals of memory elements ME1 and ME2 having a sufficient voltage and current placing memory elements ME1 and ME2 both in either a high impedance or insulative state (e.g., $V_{RESET}$ and $I_{RESET}$), or a low impedance or conductive state (e.g., $V_{SET}$ and $I_{SET}$).

In a read operation, bitlines Bl1 and Bl2 may have a capacitance that is precharged to a particular read voltage prior to closing of transistors M3 and M4 responsive to a voltage on wordline WL. Sense circuitry connected to bitlines bl1 and bl2 (not shown) may measure or detect a current on bitlines bl1 and bl2 responsive to connecting memory elements ME1 and ME2 between the reference node and precharged bitlines bl1 and bl2.

As pointed out above, impedance states of memory elements ME1 and ME2 may be detected in read operations based, at least in part, on currents on bitlines bl1 and bl2 measured or detected by sense circuits. Peripheral circuit 302 comprises an error detection and correction circuit 306 for error detection and correction. Error detection and correction circuit 306 may be applied to detected impedance states of memory elements ME1 and ME2 obtained in read operations. As pointed out above, write operations to store a single-bit value or symbol may attempt to place memory elements ME1 and ME2 in the same memory state (e.g., both memory elements ME1 and ME2 in a high impedance or insulative state, or both memory elements ME1 and ME2 in a low impedance or conductive state). Following subsequent read operations to obtain detected impedance states of memory elements ME1 and ME2, error detection and correction circuit 306 may process the obtained detected impedance states (e.g., represented as a "0" or a "1") to determine a binary symbol or value stored in memory elements ME1 and ME2. In a particular implementation, error detection and correction circuit 306 may comprise a mapping circuit (not shown) to map detected impedance states of memory elements ME1 and ME2 to a single binary symbol or value according to a mapping as illustrated in Table 2 above. In other words, error detection and correction circuit 306 may comprise a mapping circuit to apply an OR operation to detected impedance states of memory elements ME1 and ME2 to determine the single bit value or symbol being retrieved from read operations applied to memory elements ME1 and ME2.

In one alternative implementation, error detection and correction circuit 306 may optionally report detection of errors by generating a signal ERR_DET. For example detected impedance states of ME1 and ME2 obtained in read operations may be applied to an XOR operation/circuit to generate signal ERR_DET having a value of "1" if the detected impedance states of ME1 and ME2 differ. In a particular implementation, signal ERR_DET may be provided to a non-volatile memory controller (not shown) for use in diagnostic operations, for example.

In some applications or scenarios in which reliability or accuracy of read operations applied to a single bit is less critical, memory elements ME1 and ME2 may be configured to store different binary symbols or values, thereby permitting greater storage capacity for a fixed quantity of bitcells or memory elements. Here, circuit 300 may further comprise a multimodal switch circuit 304 that may, in a first selectable mode, configure circuit 300 to redundantly store a single binary symbol or value in both memory elements ME1 and ME2. In a second selectable mode, multimodal switch circuit 304 may configure circuit 300 to store two independent binary symbols or values, one independent binary symbol or value in each of memory elements ME1 and ME2. If multimodal switch circuit 304 is configured to allow circuit 300 to store two independent binary symbols or values, one independent binary symbol or value in each of memory elements ME1 and ME2, error detection and correction circuit 306 may be bypassed such that detected impedance states from read operations applied to memory elements ME1 and ME2 may represent two independent binary values or symbols.

According to an embodiment, in the aforementioned first selectable mode multimodal switch 304 may configure a mapping circuit of error detection and correction circuit 306 to map impedance states detected from read operations applied to memory elements ME1 and ME2 to a single binary value or symbol in a first selectable mode. In a second selectable mode, multimodal switch 304 may configure the mapping circuit to map a first impedance state detected from a read operation applied to memory element ME1 to a first binary symbol or value, and map a second detected impedance state from a read operation applied to memory element ME2 to a second binary value or symbol independent of the first detected impedance state of the first memory element.

Likewise, in the second selectable mode multimodal switch 304 may configure the programming circuit to apply a first programming signal to the first memory element (e.g., ME1) to place the first memory element in an impedance state representing a first binary symbol or value and apply a second programming signal to the second memory element (e.g., ME2) to place the second memory element (e.g., ME2) in an impedance state representing a second binary symbol or value in the second selectable mode.

Figure 3B:
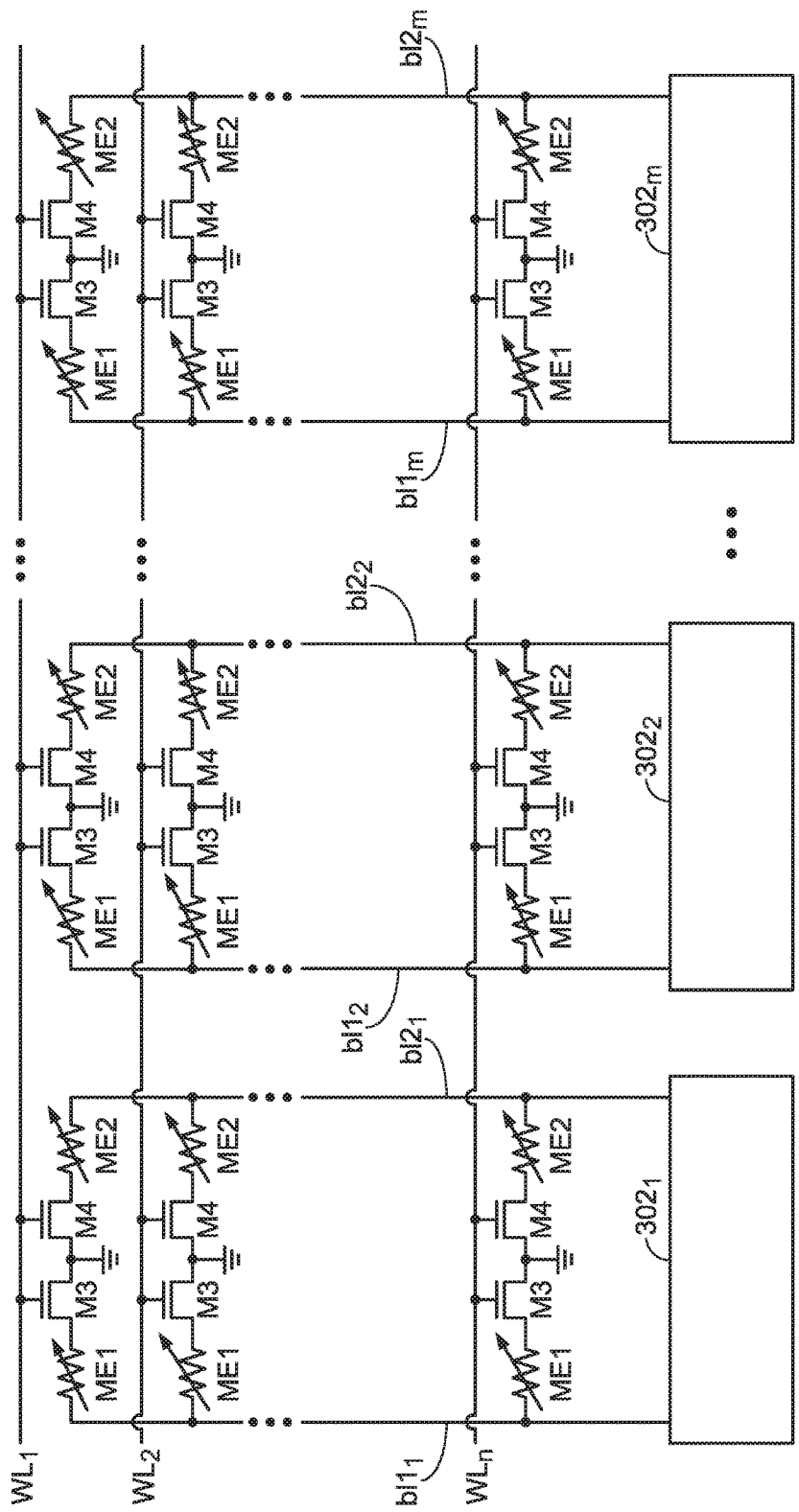
FIG. 3B is a schematic diagram for applying operations to memory elements in an array of bitcells according to an alternative embodiment.

According to an embodiment, features of circuit 300 may be replicated for implementation of an array of bitcells for error detection and correction, and multimodal operation. FIG. 3B, for example, shows implementation of peripheral circuit 302 of FIG. 3A replicated for use in processing multiple pairs of bitline signals bl1 and bl2 for multiple bitcells (in an n×m array of bicells) selected by a wordline WL. For example, peripheral circuits $302_1$ through $302m$ may process signals on pairs of bitlines $bl1_1$ and $bl2_1$ through $bl1_m$ and $bl2_m$ from bitcells selected by a signal on a wordline selected from among wordlines $WL_1$ through $WL_n$.

According to an embodiment, an array of bitcells as shown in FIG. 3B may be implemented in a single integrated device or package that may connected to a memory bus in a computing device, for example. In a particular implementation, such a single integrated device may be selectable (e.g., by a signal on an external signal pin, not shown) to operate in a selected mode. As described above, such a selected mode may configure memory elements ME1 and ME2 to store a single binary symbol or value (e.g., while performing error detection and correction at corresponding error detection and correction circuits 306 of corresponding peripheral circuits $302_1$ through $302m$), or configure memory elements ME1 and ME2 to store two binary symbols or values in memory elements ME1 and ME2, one binary symbol or value in each memory element.

Figure 4:
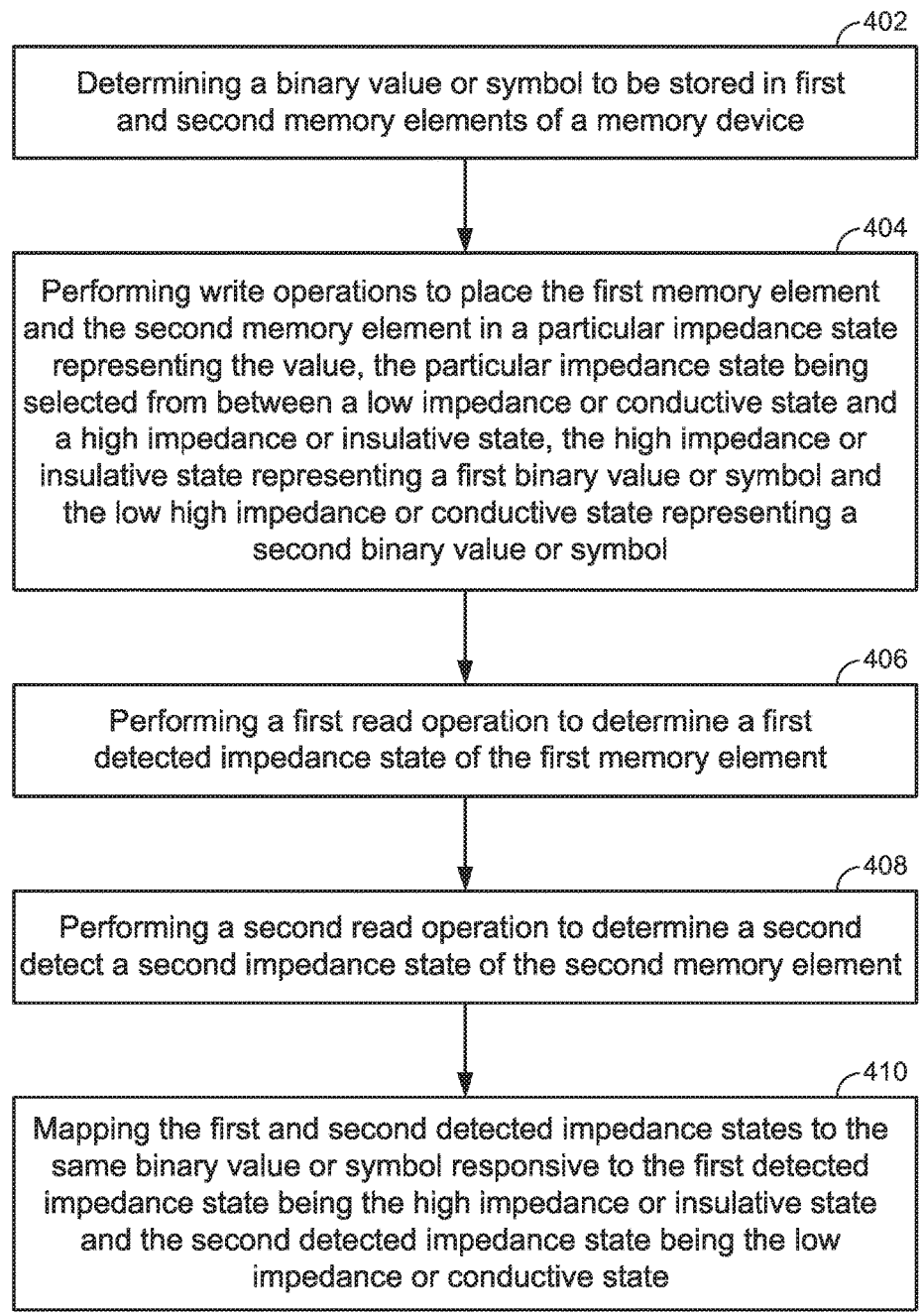
FIG. 4 is a flow diagram of a process including application of operations to memory devices according to an embodiment.

FIG. 4 is a flow diagram of a process including application of operations to memory devices according to an embodiment. In a particular implementation, actions identified in the process of FIG. 4 may be performed in connection with circuit 300 shown in FIG. 3A to redundantly store and retrieve a single binary value or symbol to memory elements ME1 and ME2. Block 402 may comprise determining a single binary value or symbol that is to be written to a storage device (e.g., for possible future retrieval). This may comprise, for example, a portion of content to be written in support of a computing operation. Block 404 may comprise write operations applied to first and second memory elements (e.g., memory elements ME1 and ME2) to attempt to place first and second memory elements in the same particular impedance state representing the same binary symbol or value. For example, block 404 may comprise write operations applied to two different CES elements to place the CES elements in the same impedance state (e.g., place both CES elements in a high impedance or conductive state to represent "0" or place both CES elements in a high impedance or conductive state to represent "1").

Blocks 406 and 408 may comprise subsequent read operations applied to the first and second memory elements following write operations at block to place the first and second memory elements in the same impedance state. It should be understood that while blocks 406 and 408 are shown as separate operations applied to first and second memory elements, actions at blocks 406 and 408 may occur simultaneously or serially. Block 410 may comprise mapping detected impedance states (e.g., represented by corresponding values expressed as "0" or "1") to a single, retrieved binary symbol or value. As indicated in Table 2 above, block 410 may if the detected impedance states are different, block 410 may map both detected impedance states to the same binary symbol or value. For example, block 410 may apply an OR operation to detected impedance states obtained at blocks 406 and 408 to map the detected impedance states to a single binary symbol or value.

Figure 5:
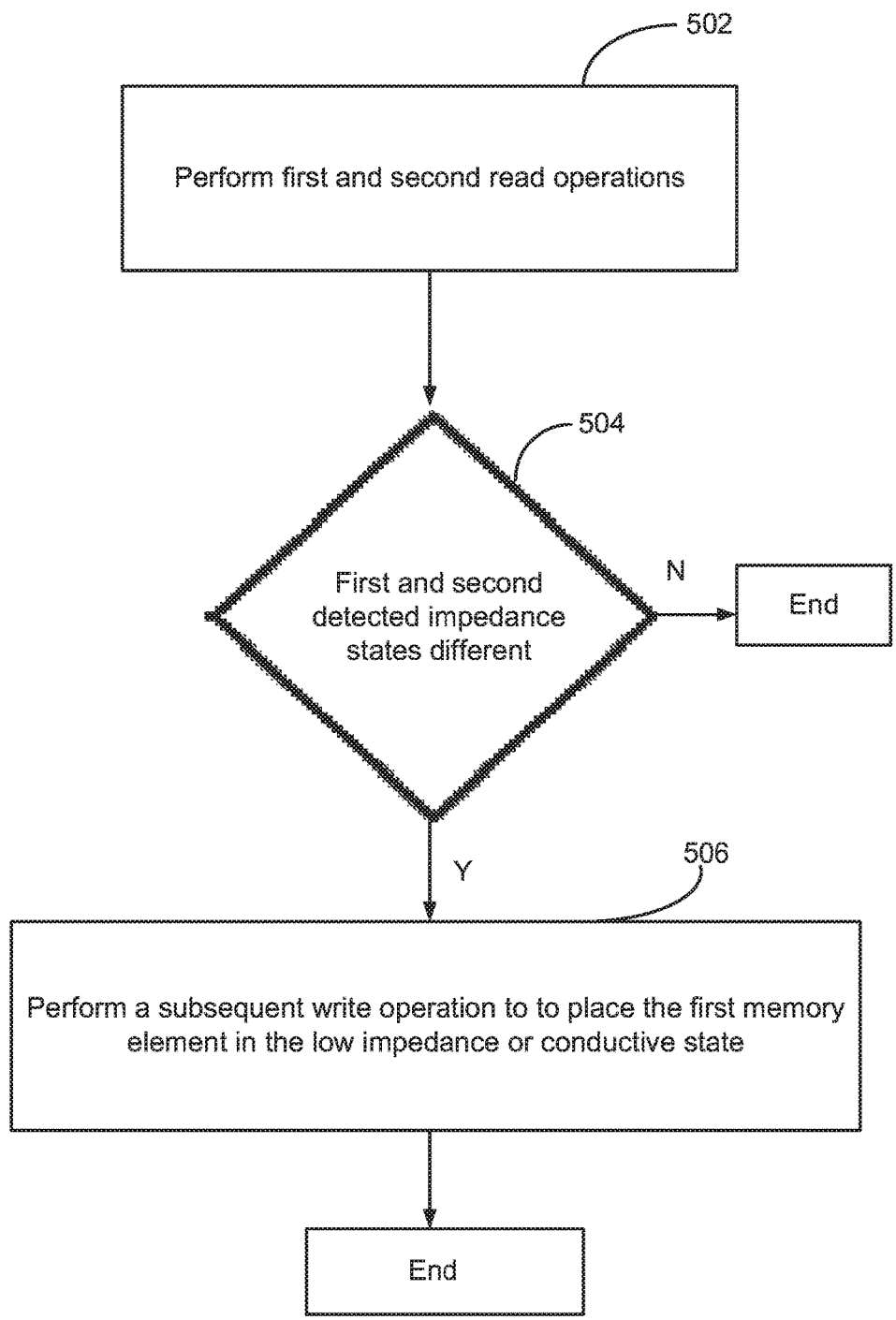
FIG. 5 is a flow diagram of a process for correcting an impedance state of a memory element according to an embodiment.

In one particular implementation, error detection and correction circuit may initiate a write operation to place memory element ME1 or ME2 in a particular impedance state if read operations at blocks 406 and 408 indicate that the detected impedance state of one of memory elements ME1 or ME2 is in error. As shown in FIG. 5, read operations at block 502, such as first and second read operations performed at blocks 406 and 408, may provide first and second detected impedance states. If the first and second detected impedance states are different as detected at diamond 504 (e.g., first impedance state is the high impedance or insulative state and the second impedance state is the low impedance or conductive state), block 506 may initiate a subsequent write operation to place the first memory element in the low impedance or conductive state (e.g., so that the impedance states of the first and second memory elements are the same).

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A method comprising:
   determining a binary value or symbol to be stored in first and second memory elements of a memory device;
   performing write operations to place the first memory element and the second memory element in a particular impedance state representing the binary value or symbol, the particular impedance state being selected from between a low impedance or conductive state and a high impedance or insulative state, the high impedance or insulative state representing a first binary value or symbol and the low impedance or conductive state representing a second binary value or symbol;

performing a first read operation to determine a first detected impedance state of the first memory element;

performing a second read operation to determine a second detected impedance state of the second memory element; and mapping the first and second detected impedance states to the same binary value or symbol responsive to the first detected impedance state being the high impedance or insulative state and the second detected impedance state being the low impedance or conductive state.

2. The method of claim 1, and further comprising mapping the first and second detected impedance states to the first binary value or symbol responsive to the first detected impedance state and the second detected impedance state being the high impedance or insulative state.

3. The method of claim 1, and further comprising mapping the first and second detected impedance states to the second binary value or symbol responsive to the first detected impedance state and the second detected impedance state being the low impedance or conductive state.

4. The method of claim 1, wherein the first binary value or symbol comprises a "0" and the second binary value or symbol comprises a "1".

5. The method of claim 1, wherein the first and second memory elements comprise first and second resistive memory elements.

6. The method of claim 1, wherein the first and second memory elements comprise first and second correlated electron switch (CES) elements.

7. The method of claim 1, wherein the first and second memory elements comprise first and second correlated electron random access memory (CeRAM) elements.

8. The method of claim 1, wherein the first read operation comprises detecting a first current responsive to application of a first read voltage across terminals of the first memory element and mapping the first current to the first detected impedance state, and wherein the second read operation comprises detecting a second current responsive to application of a second read voltage across terminals of the second memory element and mapping the second current to the second detected impedance state.

9. The method of claim 1, wherein the first and second write operations are performed concurrently.

10. The method of claim 1, wherein the method comprises performing error detection and correction for storage of the binary value or symbol in the memory device and retrieval of the binary value or symbol from the memory device.

11. The method of claim 1, and further in response to the first detected impedance being the high impedance or insulative state and the second detected impedance state being the low impedance or conductive state, performing a subsequent write operation to place the first memory element in the low impedance or conductive state.

12. The method of claim 1, wherein mapping the first and second detected impedance states to the same binary value or symbol responsive to the first detected impedance state being the high impedance or insulative state and the second detected impedance state being the low impedance or conductive state comprises mapping the first and second detected impedance states to the second binary value or symbol.

13. An apparatus comprising:
first and second memory elements;

a programming circuit to apply programming signals placing the first and second memory elements in a particular impedance state representing a determined binary value or symbol, the particular impedance state being selected from between a low impedance or conductive state and a high impedance or insulative state, the high impedance or insulative state representing a first binary value or symbol and the low high impedance or conductive state representing a second binary value or symbol;

a circuit to perform read operations to determine a first detected impedance state of the first memory element and determine a second detected impedance state of the second memory element; and a mapping circuit to map the first detected impedance state of the first memory element and the second detected impedance state of the second memory element to the same binary value or symbol responsive to the first detected impedance state being the high impedance or insulative state and the second detected impedance state being the low impedance or conductive state.

14. The device of claim 13, wherein the circuit to perform the read operations comprises circuitry to detect a current in the first and second read memory elements responsive to application of voltage applied across terminals of the first and second memory elements.

15. The device of claim 13, and further comprising a circuit to detect an error in storage of the single binary value or symbol in the first and second memory elements and retrieval of the binary value or symbol from the first and second memory elements based, at least in part, on a comparison of the first and second detected impedance states.

16. The device of claim 13, wherein the programming signals comprise a first programming signal to impart a first current and first voltage in the first memory element to place the first memory element in the particular impedance state and a second programming signal to impart a second current and second voltage in the second memory element to place the second memory element in the particular impedance state.

17. The device of claim 13, wherein the mapping circuit is further configured to map the first and second detected impedance states to the first binary value or symbol responsive to the first detected impedance state of the first detected memory state of the first memory element and the second detected impedance state of the second memory element being the high impedance or insulative state.

18. The device of claim 13, and further comprising a multimodal switch to configure the mapping circuit to map the first detected impedance state of the first memory element and the second detected impedance state of the second memory element to a single binary value or symbol in a first selectable mode, and configure the mapping circuit to map the first detected impedance state of the first memory element to a first binary value or symbol independent of the second detected impedance state of the second memory element and map the second detected impedance state of the second memory element to a second binary value or symbol independent of the first detected impedance state of the first memory element in a second selectable mode.

19. The device of claim 18, wherein the multimodal switch is to selectively configure the programming circuit to apply a first programming signal to the first memory element to place the first memory element in an impedance state representing a first binary value or symbol and apply a second programming signal to the second memory element to place the second memory element in an impedance state representing a second binary value or symbol in the second selectable mode.

20. The device of claim 18, wherein the first selectable mode is further configured to perform error correction for storage of the single binary value or symbol in the first and second memory elements and retrieval of the binary value or symbol from the first and second memory elements.

21. The device of claim 13, wherein the first and second memory elements comprise first and second correlated electron switch (CES) elements.

22. The device of claim 13, wherein the first and second memory elements comprise first and second correlated electron random access memory (CeRAM) elements.

23. An apparatus comprising:
- a plurality of bitcells formed as an array bitcells, each bitcell comprising first and second memory elements, each bitcell being coupled to at least one other bitcell by a first bitline and a second bitline; and
- a plurality of programming circuits, each programming circuit to apply programming signals placing first and second memory elements of a selected bitcell of the plurality of bitcells in a particular impedance state representing a determined binary value or symbol, the particular impedance state being selected from between a low impedance or conductive state and a high impedance or insulative state, the high impedance or insulative state representing a first binary value or symbol and the low high impedance or conductive state representing a second binary value or symbol, the programming circuit comprising:
- a circuit to perform read operations to determine a first detected impedance state of the first memory element and determine a second detected impedance state of the second memory element; and
- a mapping circuit to map the first detected impedance state of the first memory element and the second detected impedance state of the second memory element to the same binary value or symbol responsive to the first detected impedance state being the high impedance or insulative state and the second detected impedance state being the low impedance or conductive state.

* * * * *